(12) United States Patent
Tunks et al.

(10) Patent No.: US 11,758,686 B1
(45) Date of Patent: Sep. 12, 2023

(54) INDUCTION HEATER-INTEGRATED AIR MOVER

(71) Applicant: Dell Products L.P., Round Rock, TX (US)

(72) Inventors: Eric Tunks, Austin, TX (US); Owen Kidd, Cedar Park, TX (US); Walt Carver, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 2 days.

(21) Appl. No.: 17/728,364

(22) Filed: Apr. 25, 2022

(51) Int. Cl.
*H05K 7/20* (2006.01)
*G06F 1/20* (2006.01)

(52) U.S. Cl.
CPC ......... *H05K 7/20172* (2013.01); *G06F 1/206* (2013.01); *H05K 7/20209* (2013.01)

(58) Field of Classification Search
CPC .. H05K 7/20145; H05K 5/03; H05K 7/20172; H05K 7/20509
See application file for complete search history.

(56) References Cited

U.S. PATENT DOCUMENTS

| | | | | |
|---|---|---|---|---|
| 5,785,233 A * | 7/1998 | Nutter | ..................... | B23K 1/008 432/152 |
| 10,667,435 B1 * | 5/2020 | Alissa | ................. | H05K 7/20836 |
| 2007/0051007 A1 * | 3/2007 | Reets | ....................... | A47L 11/34 34/58 |
| 2008/0148748 A1 * | 6/2008 | Viegas | ..................... | B60P 3/20 62/239 |
| 2009/0168400 A1 * | 7/2009 | Liu | ..................... | F21V 33/0096 362/96 |
| 2010/0110626 A1 * | 5/2010 | Schmitt | .............. | H05K 7/20745 361/679.49 |
| 2010/0114356 A1 * | 5/2010 | Schmitt | ..................... | G06F 1/20 700/117 |
| 2011/0235272 A1 * | 9/2011 | Bash | .................. | H05K 7/20727 361/692 |
| 2013/0021746 A1 * | 1/2013 | Campbell | .......... | H05K 7/20827 165/104.13 |
| 2014/0098487 A1 * | 4/2014 | Hartman | ............... | F04D 29/522 361/679.48 |
| 2016/0025387 A1 * | 1/2016 | Prohaska | ................ | F25B 39/04 72/77 |
| 2016/0349453 A1 * | 12/2016 | Wu | ......................... | G02B 6/245 |
| 2019/0052104 A1 * | 2/2019 | Schlachte | ............... | H01T 23/00 |
| 2021/0185854 A1 * | 6/2021 | Sui | ........................ | H02J 7/0042 |

OTHER PUBLICATIONS

Lee et al. A cooler having distribution flip of airflow and cooker using the same; Espacenet English translate of KR101819370 (Year: 2018).*
GB-2125954-A, Ceiling Fan; space heaters, Kan et al. (Year: 1984).*

* cited by examiner

*Primary Examiner* — Michael A Matey
(74) *Attorney, Agent, or Firm* — Jackson Walker L.L.P

(57) ABSTRACT

An information handling system may include an information handling resource and an air mover configured to drive a flow of air. The air mover may have one or more air mover components for driving the flow of air and a coil configured to heat the one or more air mover components.

20 Claims, 3 Drawing Sheets

INDUCTION HEATER-INTEGRATED AIR MOVER

TECHNICAL FIELD

The present disclosure relates to information handling systems, and more particularly to warming of information handling system components using heated air movers, including induction heater-integrated air movers.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems are often implemented in various operating environments. Some of these operating environments may require information handling systems and their component information handling resources to start up and operate in extreme cold ambient temperatures. In some instances, information handling systems may be implemented in environments with ambient temperatures lower than 0 degrees Celsius and even as low as –40 degrees Celsius. However, some of these information handling resources (e.g., central processing unit and management controller) may not effectively operate in these extreme ambient temperatures.

Each information handling resource may have a supported operating temperature range in which such information handling resource is able to start and operate. To warm the information handling system to within all of its component information handling resources' operating temperature ranges, information handling systems are often warmed via a supply of external or internal heat to the information handling system.

Existing approaches for the supply of heat include external or internal heat supplies. External heat may be supplied naturally (i.e., operating only in warmer ambient environments) or through equipment used to supply external heat, both of which may not be sufficient to warm the information handling system or its component information handling resources and the latter of which may introduce contamination to the information handling system. Internal heat may be supplied from a high-impedance, electrically-resistive heating element internal to or adjacent to an air mover, resistive elements in a non-central location (i.e., power supply module), or dedicated solid state, resistive heating elements attached on various points of the information handling system or its chassis, all of which take up significant space in an information handling system or chassis, and may negatively affect airflow impedance to air driven by air movers, which may reduce effectiveness of thermal management systems.

SUMMARY

In accordance with the teachings of the present disclosure, the disadvantages and problems associated with warming an information handling system and its component information handling resources with an external heating supply or current-existing internal heating systems may be reduced or eliminated.

In accordance with embodiments of the present disclosure, an information handling system may include an information handling resource and an air mover configured to drive a flow of air. The air mover may have one or more air mover components for driving the flow of air and a coil configured to heat the one or more air mover components via induction heating.

In accordance with these and other embodiments of the present disclosure, a method may include, in an information handling system comprising an information handling resource and an air mover configured to drive a flow of air, the air mover comprising one or more air mover components and a coil, driving the flow of air with the one or more air mover components and heating the one or more air mover components via the coil.

In accordance with these and other embodiments of the present disclosure, an air mover for use in an information handling system comprising an information handling resource, may include one or more air mover components, a coil configured to heat the one or more air mover components, and a motor configured to drive a flow of air.

Technical advantages of the present disclosure may be readily apparent to one skilled in the art from the figures, descriptions and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Preferred embodiments and their advantages are best understood by reference to FIGS. 1 through 4B, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network storage device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, an information handling resource may broadly refer to any component system, device or apparatus of an information handling system, including without limitation a processor, bus, memory, input-output device and/or interface, storage resource (e.g., hard disk drives), network interface, electro-mechanical device (e.g., fan), display, power supply, and/or any portion thereof. An information handling resource may comprise any suitable package or form factor, including without limitation an integrated circuit package or a printed circuit board having mounted thereon one or more integrated circuits.

Figure 1:
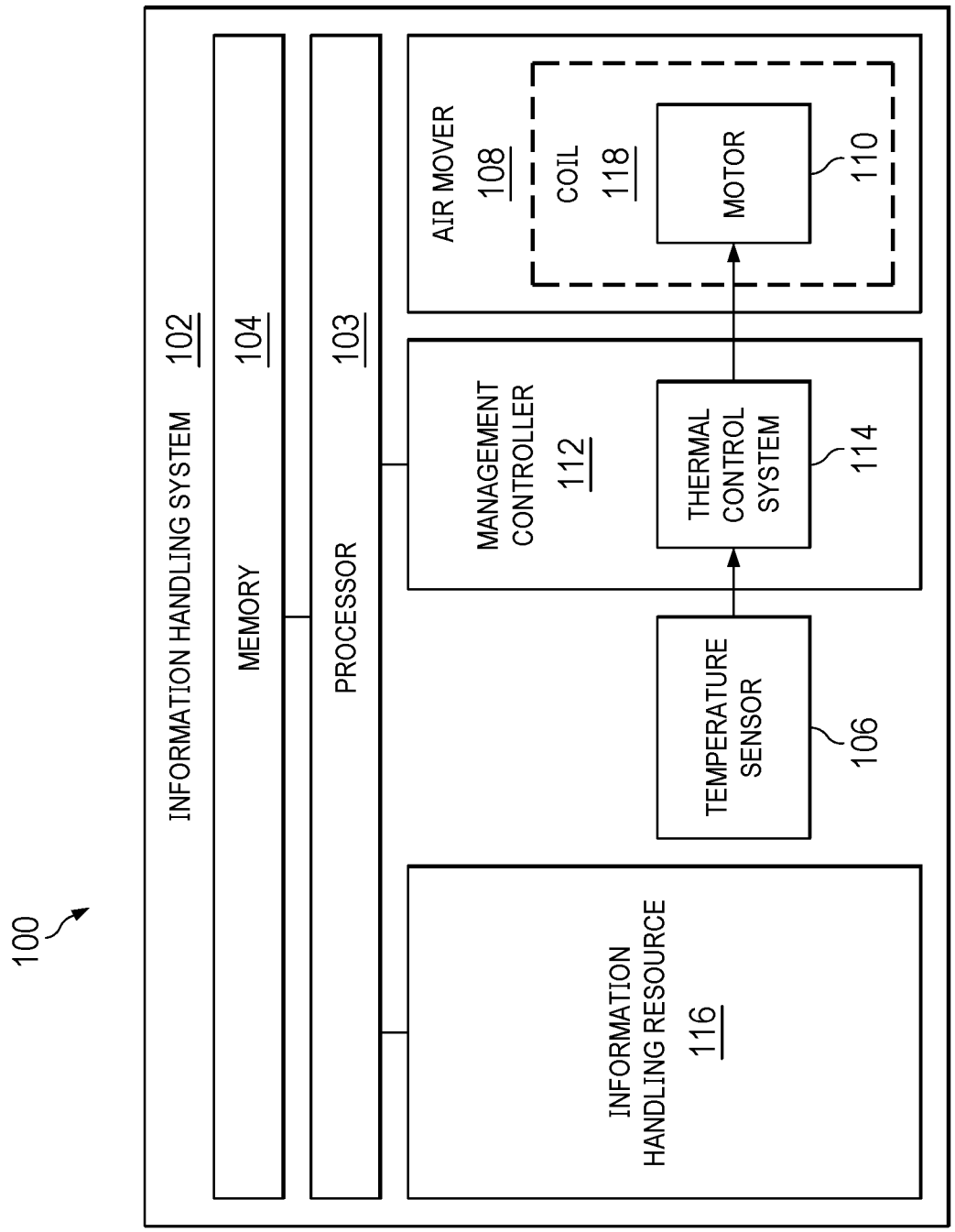
FIG. 1 illustrates a block diagram of an example information handling system, in accordance with embodiments of the present disclosure.

FIG. 1 illustrates a block diagram of an example information handling system 102, in accordance with embodiments of the present disclosure. In some embodiments, information handling system 102 may comprise a server chassis configured to house a plurality of servers or "blades". In other embodiments, information handling system 102 may comprise a personal computer (e.g., a desktop computer, laptop computer, mobile computer, and/or notebook computer). In yet other embodiments, information handling system 102 may comprise a storage enclosure configured to house a plurality of physical disk drives and/or other computer-readable media for storing data. As shown in FIG. 1, information handling system 102 may include a chassis 100 housing a processor 103, a memory 104, a temperature sensor 106, an air mover 108, a management controller 112, and an information handling resource 116.

Processor 103 may comprise any system, device, or apparatus operable to interpret and/or execute program instructions and/or process data, and may include, without limitation, a microprocessor, microcontroller, digital signal processor (DSP), application specific integrated circuit (ASIC), or any other digital or analog circuitry configured to interpret and/or execute program instructions and/or process data. In some embodiments, processor 103 may interpret and/or execute program instructions and/or process data stored in memory 104 and/or another component of information handling system 102.

Memory 104 may be communicatively coupled to processor 103 and may comprise any system, device, or apparatus operable to retain program instructions or data for a period of time. Memory 104 may comprise random access memory (RAM), electrically erasable programmable read-only memory (EEPROM), a PCMCIA card, flash memory, magnetic storage, opto-magnetic storage, or any suitable selection and/or array of volatile or non-volatile memory that retains data after power to information handling system 102 is turned off.

Management controller 112 may comprise any system, device, or apparatus configured to facilitate management and/or control of information handling system 102 and/or one or more of its component information handling resources. Management controller 112 may be configured to issue commands and/or signals to manage and/or control information handling system 102 and/or its information handling resources. Management controller 112 may comprise a microprocessor, microcontroller, DSP, ASIC, field programmable gate array ("FPGA"), EEPROM, or any combination thereof. Management controller 112 also may be configured to provide out-of-band management facilities for management of information handling system 102. Such management may be made by management controller 112 even if information handling system 102 is powered off or powered to a standby state. In certain embodiments, management controller 112 may include or may be an integral part of a baseboard management controller (BMC), a remote access controller (e.g., a Dell Remote Access Controller or Integrated Dell Remote Access Controller), or an enclosure controller. In other embodiments, management controller 112 may include or may be an integral part of a chassis management controller (CMC).

As shown in FIG. 1, management controller 112 may include a thermal control system 114. Thermal control system 114 may include any system, device, or apparatus configured to receive one or more signals indicative of one or more temperatures within information handling system 102 (e.g., one or more signals from one or more temperature sensor 106), and based on such signals, calculate an air mover driving signal and/or induction heating control signal to maintain an appropriate level of heating and/or cooling, increase heating and/or cooling, or decrease heating and/or cooling, as appropriate, and communicate such air mover driving signal and/or induction heating control signal to air mover 108. In addition to temperature information that may be collected from sensors within information handling system 102, thermal control system 114 may also calculate the air mover driving signal and/or induction heating control signal based on such information received from information handling resource 116. For example, thermal control system 114 may receive configuration data from information handling resource 116, which may include thermal requirements information of information handling resource 116.

Temperature sensor 106 may be any system, device, or apparatus (e.g., a thermometer, thermistor, etc.) configured to communicate a signal to management controller 112 or another controller indicative of a temperature within information handling system 102. In many embodiments, information handling system 102 may comprise a plurality of temperature sensors 106, wherein each temperature sensor 106 detects a temperature of a particular component and/or location within information handling system 102 (e.g., information handling resource 116 or air mover 108).

Air mover 108 may include any mechanical or electromechanical system, apparatus, or device operable to move air and/or other gases. In some embodiments, air mover 108 may comprise a fan (e.g., a rotating arrangement of vanes or blades which act on the air). In other embodiments, air mover 108 may comprise a blower (e.g., a centrifugal fan that employs rotating impellers to accelerate air received at its intake and change the direction of the airflow). In these and other embodiments, the rotating and other moving components of air mover 108 may be driven by a motor 110. The rotational speed of motor 110 may be controlled by an air mover control signal communicated from thermal control system 114 of management controller 112.

In operation, air mover 108 may cool information handling resource 116 by drawing cool air into an enclosure housing the information handling resources from outside the chassis, expelling hot air from inside the enclosure to the outside of such enclosure, and/or moving air across one or more heat sinks (not explicitly shown) internal to the enclosure to cool one or more information handling resources. Further, in operation, air mover 108 may heat information handling resources (e.g., management controller 112 and/or information handling resource 116, as shown in FIG. 1) by drawing hot air into an enclosure housing the information handling resources from outside the chassis, expelling cool air from inside the enclosure to the outside of such enclosure, and/or, as described in greater detail below, moving internally-generated hot air through the enclosure to heat one or more information handling resources. In particular embodiments, air mover 108 may comprise an induction heater-integrated air mover, such as that depicted in FIGS. 2-4B and described below.

As depicted in FIG. 1, information handling system 102 may include a coil 118 integral or otherwise proximate to air mover 108. Coil 118 may be formed from an electrical conductor (e.g., copper) and wrapped around a housing of air mover 108 as described in greater detail below.

In addition to processor 103, memory 104, temperature sensor 106, air mover 108, coil 118, management controller 112, and information handling resource 116, information handling system 102 may include one or more other information handling resources. In addition, for the sake of clarity and exposition of the present disclosure, FIG. 1 depicts only one air mover 108 and one information handling resource 116. However, in some embodiments, approaches similar or identical to those used to cool and/or heat information handling resource 116 as described herein may be employed to provide cooling and/or heating of processor 103, memory 104, management controller 112, and/or any other information handling resource of information handling system 102.

Figure 2:
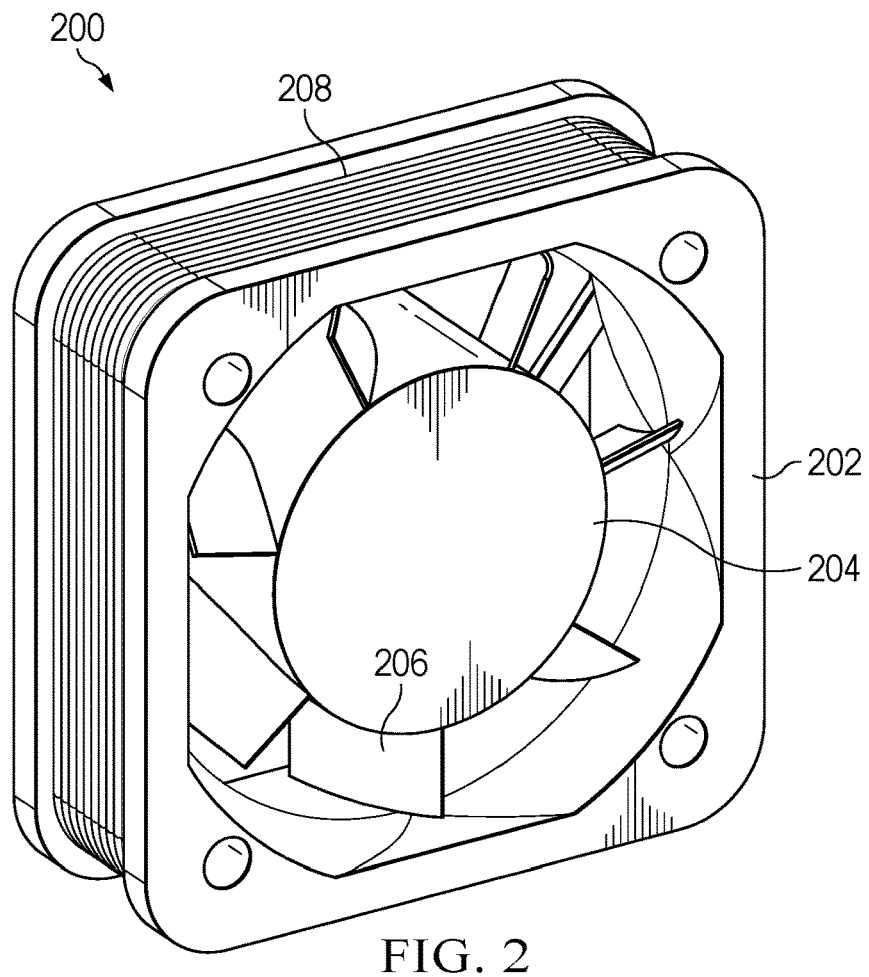
FIG. 2 illustrates a perspective view of an example induction heater-integrated air mover, in accordance with embodiments of the present disclosure.

FIG. 2 illustrates a perspective view of an example induction heater-integrated air mover 200, in accordance with the embodiments of the present disclosure. In some embodiments, air mover 200 may implement all or a portion of air mover 108 depicted in FIG. 1. Air mover 200 may include any mechanical or electromechanical system, apparatus, or device configured to generate heat and/or move heated air and/or other gases in order to heat information handling resources of information handling system 102. Air mover 200 may comprise an air mover housing 202 configured to house air mover 200, motor 204, one or more air mover blades 206, a coil 208 for induction heating, and one or more other components. Air mover housing 202 may comprise an enclosure configured to house and/or provide mechanical structure for the one or more components of induction heater-integrated air mover 200.

An air mover blade 206 may be any rotational component or apparatus (e.g., vane, blade, impeller) of air mover 200 formed from electrically-conductive material. For example, as shown in FIG. 2, air mover blades 206 may be mechanically coupled to motor 204 and configured to rotate about an axis and act on the air and/or change the direction of airflow.

As shown in FIG. 2, in some embodiments, coil 208 may be mechanically coupled to air mover housing 202 and arranged such that coil 208 has little or no impact on required space of air mover 200 and/or within information handling system 102. In such embodiments, coil 208 and air mover blades 206 may be arranged in proximity to one another such that one or more of air mover blades 206 is inductively-coupled to coil 208. Accordingly, an alternating electrical current through coil 208 may induce eddy currents in one or more air mover blades 206, causing such one or more air mover blades 206 to increase in temperature via inductive heating. Heat generated within the one or more air mover blades 206 via inductive heating may be transferred to air driven by air mover 200.

In some embodiments, air mover 200 may include at least three modes. A first mode may be used when environmental conditions are moderate (e.g., outside air is neither "too hot" nor "too cold"). In this first mode, air mover 200 may be disabled (e.g., turned "off").

A second mode may be used in conditions in which the outside air is too hot for the information handling system to be used as is. In this second mode, thermal control system 114 may control a speed of air mover 200 via an air mover driving signal (e.g., a serial pulse width modulated signal) communicated via the PWM wire of cable 404. A tachometer (not expressly shown) of motor 204 (or a rotor of air mover 200) may generate a signal indicative of a speed of air mover 200, which may be communicated via a tach wire of a cable coupled to thermal control system 114, thus providing feedback to thermal control system 114 to enable thermal control system 114 to determine an appropriate air mover driving signal by considering the measured air mover speed received via the tach wire. In the second mode, induction heating of air mover 200 may not be enabled.

A third mode may be used in conditions in which the outside air is too cold for the information handling system to be used as is. In this third mode, thermal control system 114 may control the speed of air mover 200 via an air mover driving signal such that the air mover speed is constant. In addition, in the third mode, induction heating of air mover 200 may be enabled in order to heat the air inside the information handling system such that the information handling system is heated to within a desired operating range of temperatures for one or more information handling resources of information handling system 102.

Figure 3:
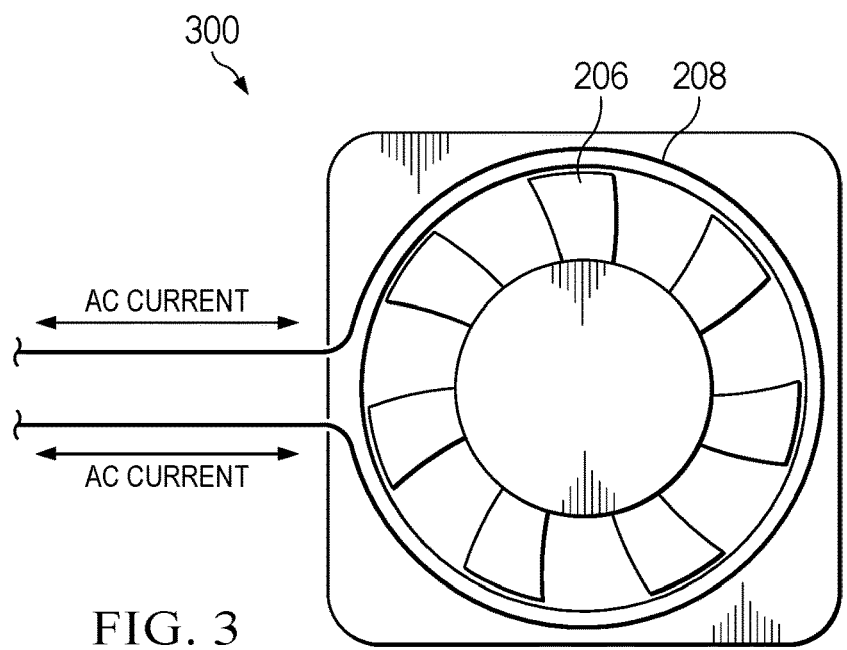
FIG. 3 illustrates a front elevation view of an example induction heater-integrated air mover powered from an alternating current (AC) power supply, in accordance with embodiments of the present disclosure.

FIG. 3 illustrates a front elevation view of an example induction heater-integrated air mover 300 powered from an alternating current (AC) power supply, in accordance with embodiments of the present disclosure. In some embodiments, air mover 300 may implement all or a portion of air mover 108 depicted in FIG. 1 and/or all or a portion of air mover 200 depicted in FIG. 2. As shown in FIG. 3, in some embodiments, a power supply (not pictured) may apply AC electrical energy to coil 208 such that a variable electromagnetic field is generated by coil 208. The electromagnetic field generated by coil 208 may induce electrical currents (e.g., eddy currents) inside one or more air mover blades 206 and thereby cause heat to be generated within the one or more air mover blades 206 themselves. Accordingly, air mover 200 may uniformly move air heated by such internally-generated heat through information handling system 102 to heat information handling resource components of information handling system 102 without a separate heat source supplied via heat conduction. Induction heating of air mover blade 206 may allow for rapid heating of information handling system 102 and its information handling resources and may minimize airflow-restricting additions to information handling system 102 traditionally used to provide heated air flow.

Figure 4A:
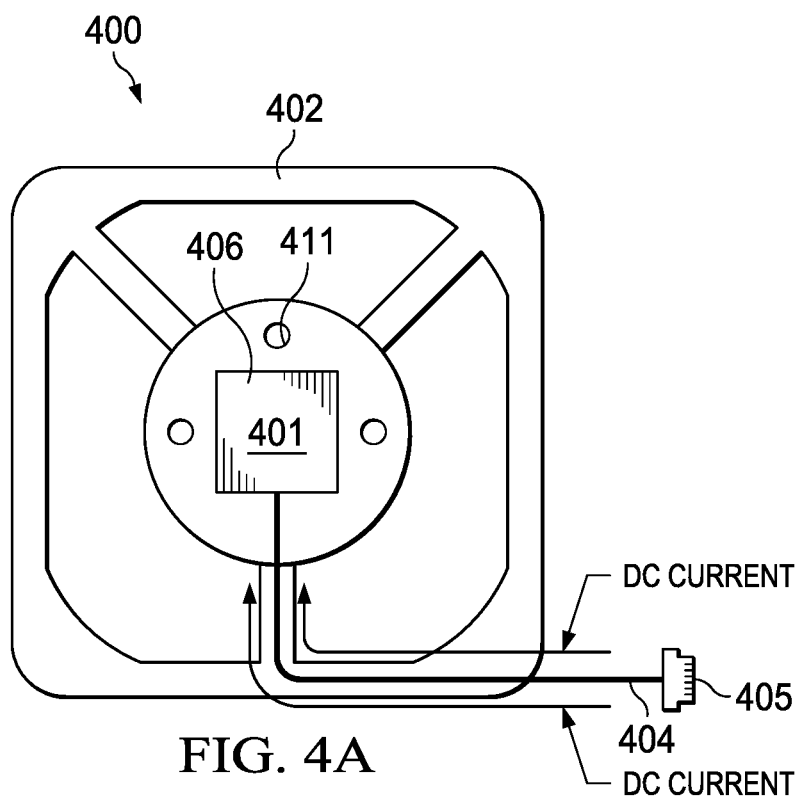
FIGS. 4A and 4B each illustrate a front elevation view of an example induction heater-integrated air mover powered from a direct current (DC) power supply, in accordance with embodiments of the present disclosure.
Figure 4B:
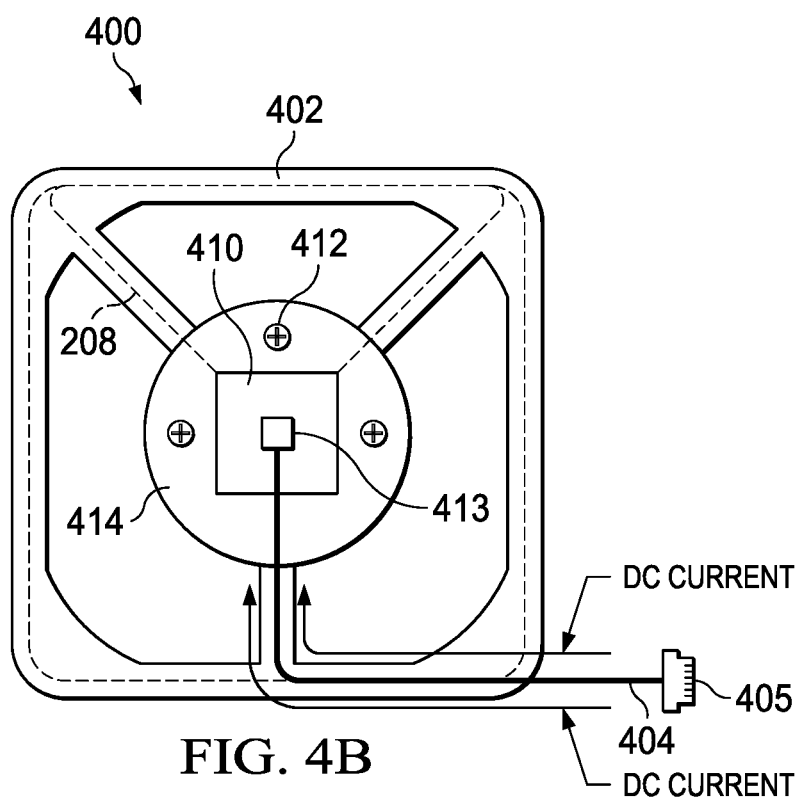

FIGS. 4A and 4B each illustrate a front elevation view of an example induction heater-integrated air mover 400 powered from a direct current (DC) power supply, in accordance with embodiments of the present disclosure. In some embodiments, air mover 400 may implement all or a portion of air mover 108 depicted in FIG. 1 and/or all or a portion of air mover 200 depicted in FIG. 2. For purposes of clarity and exposition, air mover 400 is shown in FIGS. 4A and 4B without air mover blades, despite that air mover blades may be present in order to enable induction heating of air mover blades, as described in greater detail below.

As shown in FIGS. 4A and 4B, air mover 400 may include a motor control board 401 and an inductor heating control board 410. Motor control board 401 may include any system, device, or apparatus configured to receive one or more control signals via a cable 404 and electrical energy in the form of a DC electrical current, and control operation of a motor (e.g., motor 204) of air mover 400 to provide a desired airflow. As shown in FIGS. 4A and 4B, cable 404 may be terminated with a connector 405, and may include a power (+) wire, a ground (−) wire, a tachometer (tach) wire, and a PWM wire as is typical with many air movers.

As shown in FIGS. 4A and 4B, inductor heating control board 410 may be disposed on a mechanical assembly 414 configured to mechanically couple to housing 402 (e.g., via fasteners 412 driven into corresponding threaded bores 411 of housing 402). However, although FIGS. 4A and 4B contemplate inductor heating control board 410 mounted over motor control board 401, in some embodiments, motor control board 401 may be mounted over inductor heating control board 410. In yet other embodiments, motor control board 401 and inductor heating control board 410 may be integrated within the same circuit board.

Inductor heating control board 410 may comprise a circuit board electrically coupled to coil 208 and communicatively coupled to thermal control system 114 and management controller 112 via cable 404. As shown in FIG. 4B, cable 404 may provide the same DC power supply to inductor heating control board 410 as being supplied to motor control board 401.

In some embodiments, inductor heating control board 410 may include DC to AC converter (DC/AC converter) 413 configured to convert the DC power source received via cable 404 to an AC power source. This AC power supply may then be applied to coil 208. Thus, in operation, power wire and ground wire of cable 404 may provide electrical energy to coil 208 to inductively heat air mover blades 206 based on environmental conditions, as described in greater detail above. Use of DC/AC converter 413 may eliminate the need for a separate and/or additional AC power supply external to air mover 400 for induction heating of air mover blades 206.

An induction heater-integrated air mover system should not be seen as limited to heating an information handling system and its information handling resource components. Instead, an induction heater-integrated air mover system may be used in any suitable system to cool, heat, move air, condition air, etc.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. An information handling system comprising:
   an information handling resource; and an air mover configured to drive a flow of air, wherein the air mover comprises:
one or more air mover components for driving the flow of air; and
a coil configured to heat the one or more air mover components.

2. The information handling system of claim 1, wherein the coil is inductively coupled to the one or more air mover components and further configured to heat the one or more air mover components via induction heating.

3. The information handling system of claim 1, further comprising a thermal control system configured to communicate control signals to the air mover for controlling heating of the one or more air mover components via the coil.

4. The information handling system of claim 1, further comprising a thermal control system configured to control heating of the one or more air mover components via the coil based on a temperature sensed by a temperature sensor.

5. The information handling system of claim 1, wherein the one or more air mover components comprise a blade for driving air flow from the air mover.

6. The information handling system of claim 1, wherein the coil is powered from an alternating current power source external to the air mover.

7. The information handling system of claim 1, wherein the air mover further comprises a direct current to alternating current converter and the coil is powered from a direct current power source configured to power a motor for driving the flow of air, further wherein the direct current to alternating current converter converts the direct current power source to an alternating current power source for powering the coil.

8. A method comprising, in an information handling system comprising an information handling resource and an air mover configured to drive a flow of air, the air mover comprising one or more air mover components and a coil:
driving the flow of air with the one or more air mover components; and
heating the one or more air mover components via the coil.

9. The method of claim 8, wherein the coil is inductively coupled to the one or more air mover components and the method further comprises heating the one or more air mover components via induction heating.

10. The method of claim 8, further comprising controlling heating of the one or more air mover components via the coil.

11. The method of claim 8, further comprising controlling heating of one or more air mover components via the coil based on a temperature sensed by a temperature sensor.

12. The method of claim 8, wherein the one or more air mover components comprise a blade for driving air flow from the air mover.

13. The method of claim 8, further comprising powering the coil from an alternating current power source external to the air mover.

14. The method of claim 8, further comprising converting a direct power source configured to power a motor for driving the flow of air to an alternating current power source for powering the coil.

15. An air mover for use in an information handling system comprising an information handling resource, the air mover comprising:
one or more air mover components;
a coil configured to heat the one or more air mover components; and
a motor configured to drive a flow of air.

16. The air mover of claim 15, wherein the coil is inductively coupled to the one or more air mover components and configured to heat the one or more air mover components via induction heating.

17. The air mover of claim 15, further comprising circuitry configured to receive control signals from a thermal control system of the information handling system for controlling heating of the one or more air mover components via the coil.

18. The air mover of claim 15, wherein the one or more air mover components comprise a blade for driving air flow from the air mover.

19. The air mover of claim 15, wherein the coil is powered from an alternating current power source external to the air mover.

20. The air mover of claim 15, further comprising a direct current to alternating current converter and wherein the coil is powered from a direct current power source configured to power a motor for driving the flow of air, further wherein the direct current to alternating current converter converts the direct current power source to an alternating current power source for powering the coil.

\* \* \* \* \*